(12) United States Patent
Shibata et al.

(10) Patent No.: US 10,202,693 B2
(45) Date of Patent: Feb. 12, 2019

(54) GAS BARRIER FILM, FILM SUBSTRATE PROVIDED WITH GAS BARRIER FILM, AND ELECTRONIC DEVICE INCLUDING THE FILM SUBSTRATE

(71) Applicant: Panasonic Intellectual Property Management Co., Ltd., Osaka (JP)

(72) Inventors: Masaomi Shibata, Osaka (JP); Kenji Okumoto, Osaka (JP); Gosuke Sakamoto, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 168 days.

(21) Appl. No.: 14/716,909

(22) Filed: May 20, 2015

(65) Prior Publication Data
US 2015/0343741 A1 Dec. 3, 2015

(30) Foreign Application Priority Data
May 27, 2014 (JP) .................................. 2014-109455

(51) Int. Cl.
| | | |
|---|---|---|
| *C23C 16/40* | (2006.01) | |
| *C23C 28/00* | (2006.01) | |
| *C23C 28/04* | (2006.01) | |
| *H01L 51/52* | (2006.01) | |

(52) U.S. Cl.
CPC ............ *C23C 28/42* (2013.01); *C23C 16/403* (2013.01); *C23C 16/405* (2013.01); *C23C 28/042* (2013.01); *H01L 51/5256* (2013.01); *B32B 2307/7242* (2013.01); *Y10T 428/265* (2015.01)

(58) Field of Classification Search
USPC ........ 136/259; 428/336, 697, 698, 699, 701, 428/702
See application file for complete search history.

(56) References Cited

U.S. PATENT DOCUMENTS

| | | | | |
|---|---|---|---|---|
| 8,039,739 B1 * | 10/2011 | Capps | ................... | H01L 31/048 136/251 |
| 2010/0089636 A1 * | 4/2010 | Ramadas | ............... | B82Y 15/00 174/521 |
| 2010/0178481 A1 * | 7/2010 | George | ................. | C23C 16/402 428/213 |

(Continued)

FOREIGN PATENT DOCUMENTS

| | | |
|---|---|---|
| JP | 2003-089165 | 3/2003 |
| JP | 2008-537979 | 10/2008 |

(Continued)

*Primary Examiner* — Archene A Turner
(74) *Attorney, Agent, or Firm* — Greenblum & Bernstein, P.L.C.

(57) ABSTRACT

A gas barrier film includes two or more first barrier layers each made of a first inorganic material and one or more second barrier layers each made of a second inorganic material different from the first inorganic material. Each of the two or more first barrier layers and each of the one or more second barrier layers are alternately stacked. The first inorganic material comprises aluminum oxide. Each of the two or more first barrier layers has a thickness of 3 nm or more. The total thickness of the two or more first barrier layers is 20 nm or less. The two or more first barrier layers and the one or more second barrier layers are formed by atomic layer deposition.

9 Claims, 14 Drawing Sheets

(56) References Cited

U.S. PATENT DOCUMENTS

| | | |
|---|---|---|
| 2010/0215929 A1 | 8/2010 | Seo et al. |
| 2013/0157062 A1 | 6/2013 | Kihara et al. |

FOREIGN PATENT DOCUMENTS

| | | |
|---|---|---|
| JP | 2009-275251 | 11/2009 |
| JP | 2010-199060 | 9/2010 |
| JP | 2010-532917 | 10/2010 |
| JP | 2014-524982 | 9/2014 |
| WO | 20061101857 | 9/2006 |
| WO | 2009/002892 A1 | 12/2008 |
| WO | 20121020771 | 2/2012 |
| WO | 20131009913 | 1/2013 |

\* cited by examiner

THREE-TIER STRUCTURE

TEN-TIER STRUCTURE

TWO-TIER STRUCTURE

FIVE-TIER STRUCTURE

ONE-TIER STRUCTURE
TOTAL THICKNESS 20 nm

FOUR-TIER STRUCTURE

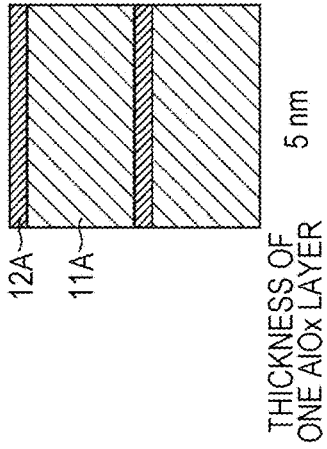
FIG. 10A
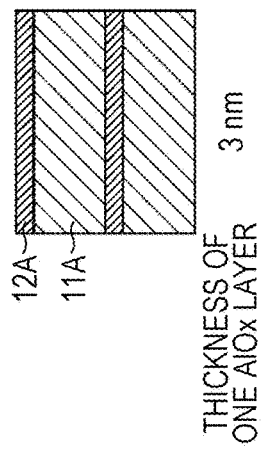
FIG. 10B
FIG. 10C
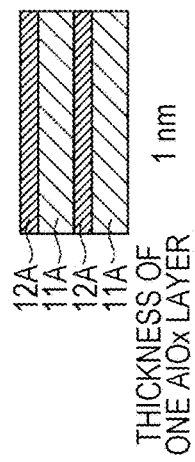
FIG. 10D
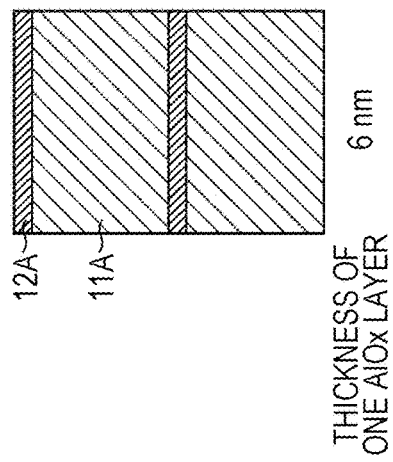
FIG. 10E
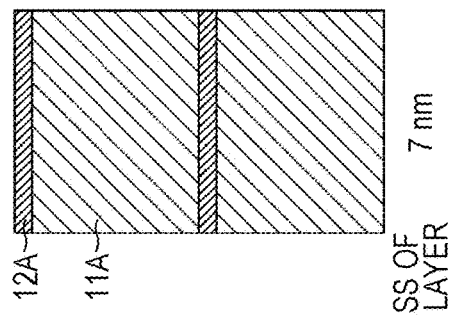

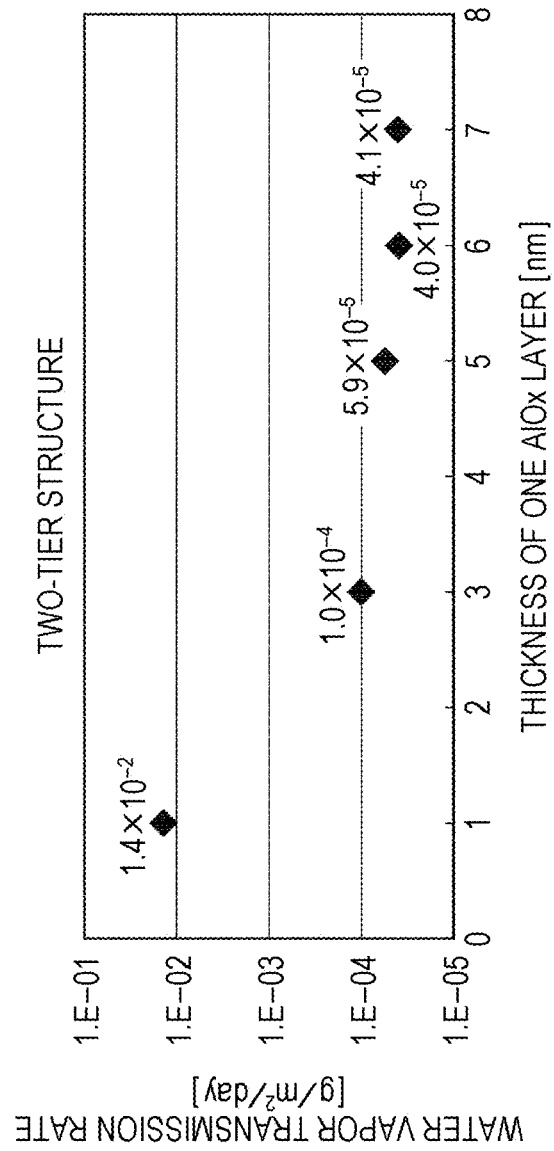

20 nm 40 nm 60 nm 20 nm 40 nm 60 nm

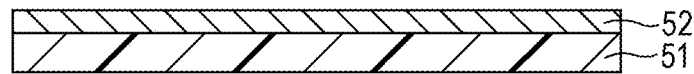
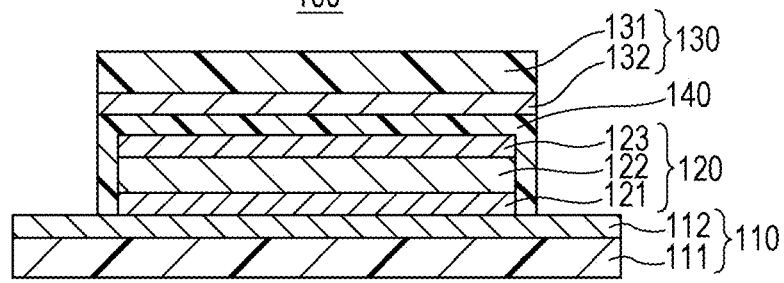
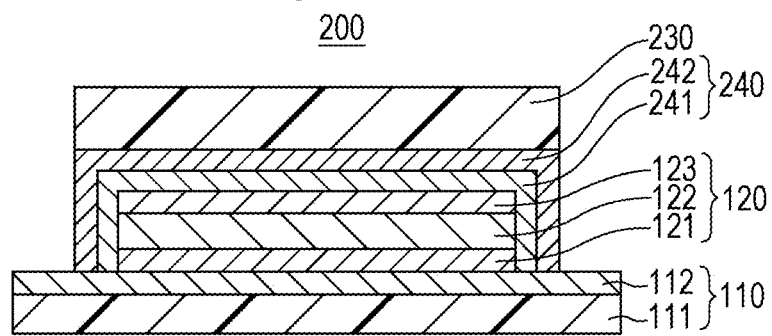

US 10,202,693 B2

GAS BARRIER FILM, FILM SUBSTRATE PROVIDED WITH GAS BARRIER FILM, AND ELECTRONIC DEVICE INCLUDING THE FILM SUBSTRATE

BACKGROUND

1. Technical Field

The present disclosure relates to a gas barrier film made of an inorganic material, a film substrate provided with the gas barrier film, and an electronic device including the film substrate.

2. Description of the Related Art

Displays mounted on, for example, portable information terminals are required to be reduced in thickness and weight. Recently, demands for displays having high shock resistance and high flexibility, in addition to the reduced thickness and weight, are growing. Accordingly, film substrates made of resin materials have been investigated as substrates for displays, instead of the existent glass substrates.

Film substrates are, however, inferior to glass substrates in the gas barrier property. Display elements (e.g., organic EL elements) formed on a film substrate has a risk of being deteriorated with time by being brought into contact with water and oxygen infiltrated through the film substrate during the use of the display. The deterioration of the display elements causes, for example, occurrence of non-emitting parts (dark spots) in the display region of a display and a reduction in brightness.

SUMMARY

One non-limiting and exemplary embodiment provides a gas barrier film made of an inorganic material and having a high gas barrier property and high bending resistance, a film substrate provided with the gas barrier film, and an electronic device including the film substrate.

In one general aspect, the techniques disclosed here feature a gas barrier film comprising two or more of first barrier layers each made of a first inorganic material and one or more of second barrier layers each made of a second inorganic material different from the first inorganic material. Each of the two or more first barrier layers and each of the one or more second barrier layers are alternately stacked. The first inorganic material comprises aluminum oxide. Each of the two or more first barrier layers has a thickness of 3 nm or more. The total thickness of the two or more first barrier layers is 20 nm or less. The two or more first barrier layers and the one or more second barrier layers are formed by atomic layer deposition.

Since the gas barrier film has a multilayer structure comprising first barrier layers and a second barrier layer where the first barrier layers each have a thickness of not less than 3 nm, a high gas barrier property can be achieved. In addition, since the total thickness of the first barrier layers is not larger than 20 nm, high bending resistance can be achieved. The details thereof will be described later.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIGS. 10A to 10E are schematic cross-sectional views of samples in Experiment 3;

FIG. 11 is a graph showing the measured water vapor transmission rates of samples in Experiment 3;

FIG. 15 is a cross-sectional view schematically illustrating a film substrate provided with a gas barrier film according to an embodiment of the present disclosure;

FIG. 16 is a cross-sectional view schematically illustrating an electronic device according to an embodiment of the present disclosure;

FIG. 17 is a cross-sectional view schematically illustrating a modification example of an electronic device according to an embodiment of the present disclosure;

DETAILED DESCRIPTION

Figure 1:
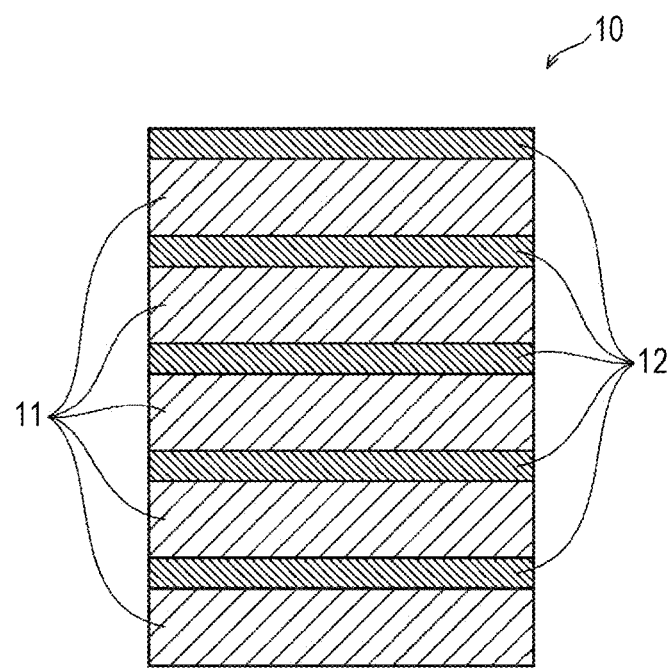
FIG. 1 is a cross-sectional view schematically illustrating a gas barrier film according to an embodiment of the present disclosure.

A structure including a gas barrier film made of an inorganic material disposed between a film substrate and a display element has been studied. Such a gas barrier film has a dense film quality and can exhibit a high gas barrier property. A typical material of the gas barrier film is aluminum oxide (e.g., see Japanese Unexamined Patent Application Publication No. 2009-275251 and Japanese Unexamined Patent Application Publication (Translation of PCT Application) No. 2008-537979).

However, the gas barrier films of inorganic materials have a disadvantage, low bending resistance. Specifically, bending of such a gas barrier film causes defects, such as cracking. Thus, a high gas barrier property is difficult to be secured.

The gas barrier film according to an embodiment of the present disclosure comprises two or more first barrier layers each made of a first inorganic material, and one or more second barrier layers each made of a second inorganic material different from the first inorganic material. Each of the two or more first barrier layers and each of the one or more second barrier layers are alternately stacked. The first inorganic material is aluminum oxide. Each of the two or more first barrier layers has a thickness of 3 nm or more. The total thickness of the two or more first barrier layers is 20 nm or less. Since the gas barrier film includes a multilayer structure comprising first barrier layers and a second barrier layer where the first barrier layers each have a thickness of not less than 3 nm, a high gas barrier property can be achieved. In addition, since the total thickness of the first barrier layers is not larger than 20 nm, high bending resistance can be achieved.

In the gas barrier film according to an embodiment of the present disclosure, the two or more first barrier layers and the one or more second barrier layers are formed by atomic layer deposition. As a result, each of the two or more first barrier layers and each of the one or more second barrier layers can have good coatability and high compactness, and the gas barrier film can have a high gas barrier property. Atomic layer deposition allows each of the two or more first barrier layers and each of the one or more second barrier layers to be formed in a single chamber by appropriately changing the supply of a source gas for the first barrier layer and a source gas for the second barrier layer. Such formation can shorten the time for forming the layers and is advantageous from the viewpoint of tact time, compared to the case of forming the first barrier layers and the second barrier layer by different methods.

The total thickness of the two or more first barrier layers and the one or more second barrier layers may be 20 nm or less. The total thickness of the two or more first barrier layers and the one or more second barrier layers is the sum of the total thickness of the individual first barrier layers and the total thickness of the individual second barrier layers. The time for forming the gas barrier film can therefore be shortened, which is advantageous from the viewpoint of tact time.

The gas barrier film may have a water vapor transmission rate of $1.0 \times 10^{-4}$ g/m$^2$/day or less. Such a gas barrier film can be used suitably for an electronic element (e.g., organic EL element) that is weak against water and oxygen.

The second inorganic material may be an oxide of at least one metal selected from the group consisting of zirconium, zinc, silicon, titanium, hafnium, tantalum, and lanthanum. The second inorganic material may be a nitride or an oxynitride of at least one metal selected from the group consisting of zirconium, zinc, silicon, aluminum, titanium, hafnium, tantalum, and lanthanum. Such a gas barrier film can have an enhanced gas barrier property.

A film substrate provided with the gas barrier film according to an embodiment of the present disclosure includes a film substrate and the above-described gas barrier film disposed on the film substrate.

An electronic device according to an embodiment of the present disclosure includes a film substrate, the above-described gas barrier film disposed on the film substrate, and an electronic element disposed on the gas barrier film.

An electronic device according to an embodiment of the present disclosure includes an electronic element and the above-described gas barrier film disposed on or above the electronic element. The term "on or above" includes not only a case of being in direct contact with the electronic element but also a case of having any layer, for example, a resin film and/or an inorganic insulating film, therebetween.

The embodiments described below are merely exemplary examples of the present disclosure. For example, the numerical values, shapes, materials, components, arrangement positions and connection configuration of the components, steps, and the order of the steps shown in the following embodiments are merely examples and are not intended to limit the scope of the present disclosure. Among the components in the following embodiments, components that are not mentioned in the independent claims describing the broadest concept of the present disclosure will be described as optional components for more preferable modes.

Embodiments

Structure of Gas Barrier Film

FIG. 1 is a cross-sectional view schematically illustrating a gas barrier film according to an embodiment of the present disclosure. The gas barrier film 10 has a multilayer structure including first barrier layers 11 and second barrier layers 12 that are alternately stacked. The multilayer structure shown in FIG. 1 is composed of five first barrier layers 11 and five second barrier layers 12. Structure of first and second barrier layers The first barrier layers 11 are made of a first inorganic material. The first inorganic material can be aluminum oxide. An aluminum oxide film has a high gas barrier property.

The second barrier layers 12 are made of a second inorganic material. The second inorganic material can be, for example, an oxide of at least one metal selected from the group consisting of zirconium, zinc, silicon, titanium, hafnium, tantalum, and lanthanum. The second inorganic material can be, for example, a nitride or an oxynitride of at least one metal selected from the group consisting of zirconium, zinc, silicon, aluminum, titanium, hafnium, tantalum, and lanthanum.

When the gas barrier film is disposed, for example, on the light extraction side of a light-emitting device, the first and second barrier layers 11, 12 may be made of materials having high light transmittance.

The first and second inorganic materials are different from each other. In this embodiment, the first barrier layers 11 are made of aluminum oxide (alumina), and the second barrier layers 12 are made of zirconium oxide (zirconia).

The first and second barrier layers 11, 12 can be formed by, for example, atomic layer deposition (hereinafter, referred to as "ALD"), CVD, or sputtering. In this embodiment, the first and second barrier layers 11, 12 are formed by ALD.

The gas barrier property of the gas barrier film 10 increases with an increase in the total thickness of the first and second barrier layers 11, 12, i.e., the thickness of the gas barrier film 10. A too large thickness of the gas barrier film 10, however, elongates the tact time and is disadvantageous from the point of productivity. In addition, a too large thickness of the gas barrier film 10 increases the risk of warping or cracking by internal stress. From these viewpoints, the total thickness of the first and second barrier layers 11, 12, i.e., the thickness of the gas barrier film 10 may be 20 nm or less.

In addition, as described below, in order to secure the high gas barrier property of the gas barrier film 10, the thickness of each first barrier layer 11 may be 3 nm or more. In order to secure the high bending resistance of the gas barrier film 10, the total thickness of the first barrier layers 11 may be 20 nm or less.

The thicknesses of the first and second barrier layers 11, 12 may be the same as or similar to each other. The thicknesses of the first and second barrier layers 11, 12 may be different from each other. In this embodiment, the first and second barrier layers 11, 12 have thicknesses different from each other. In addition, as described below, since the gas barrier property of the gas barrier film 10 is mainly achieved by the first barrier layers 11, the first barrier layers 11 each may have a thickness larger than those of the second barrier layers 12. Process of forming first and second barrier layers In this embodiment, the first and second barrier layers 11, 12 are formed by ALD. ALD is a method for forming a thin film by alternately introducing a source gas (precursor gas) and a reactant gas into a chamber to deposit one atomic layer of a reaction product at a time on a surface of a substrate set in the chamber. In order to promote the reaction, any known method, such as generation of plasma in the chamber (plasma ALD) or heating of the substrate (thermal ALD), may be employed.

Figure 2:
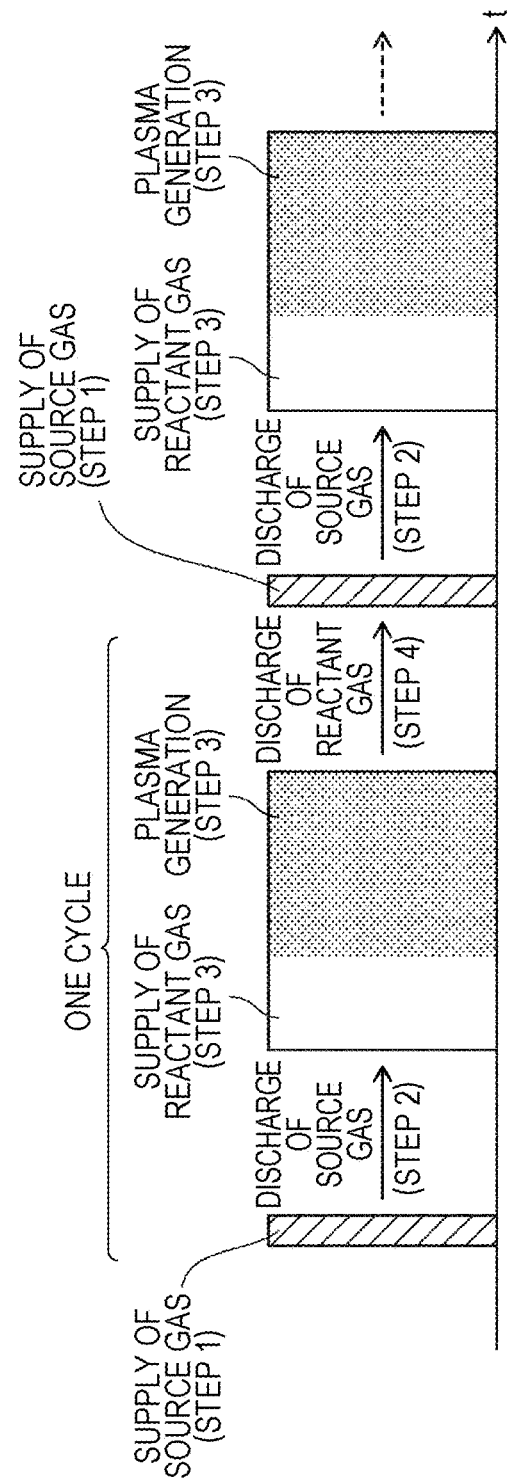
FIG. 2 is a diagram showing a sequence of film formation by plasma ALD.

FIG. 2 is a diagram showing a sequence of film deposition by plasma ALD. A substrate is heated with a heater to a desired temperature in a vacuum chamber under a reduced pressure. For example, an appropriate temperature is selected within a range of room temperature to 350° C. depending on the type of a source gas. After completion of the heating, with maintaining the temperature, the source gas is supplied to the chamber to start film formation (Step 1: supply of source gas). After adsorption of the source gas on the surface of the substrate, the supply of the source gas is stopped, and the unbound source gas is discharged (Step 2: discharge of source gas). On this occasion, sufficient discharge of the excess gas can prevent the film quality from being reduced by contamination with impurities. In general, supply of an inert gas into the chamber can assist the discharge of the excess gas. This inert gas is also called purge gas. The inert gas may be supplied continuously during the film-forming process or may be supplied only during the discharge of the source gas. In the case of forming an aluminum oxide thin film, the inert gas can be, for example, an argon (Ar) gas. Examples of the inert gas include nitrogen, hydrogen, oxygen, and carbon dioxide gases, in addition to the argon gas. Subsequently, a reactant gas is supplied into the chamber to react with the source adsorbed on the surface. On this occasion, in order to promote the reaction, plasma is generated in the chamber (Step 3: supply of reactant gas and plasma formation). After a predetermined lapse of time, the supply of the reactant gas and the generation of plasma are stopped, and the excess reactant gas is discharged (Step 4: discharge of reactant gas). On this occasion, an inert gas may be supplied into the chamber. Thus, one atomic layer is formed on the substrate. This process is referred to as one cycle, and is repeated until a film having a desired thickness is formed. For example, in a case of aluminum oxide, the thickness of one atomic layer is about 1 angstrom, and the process is repeated about 100 cycles to give a film having a thickness of 10 nm. In general, the cycle is performed by supplying a gas and, at the same time, discharging the gas with a vacuum pump. The process, therefore, can easily control the film thickness and forms atomic layers one by one. The film thereby has excellent step coatability (step coverage).

The first barrier layer 11 and the second barrier layer 12 can be alternately deposited by switching between the source gases of the first barrier layer 11 and the second barrier layer 12.

Method of Measuring Water Vapor Transmission Rate

Figure 3:
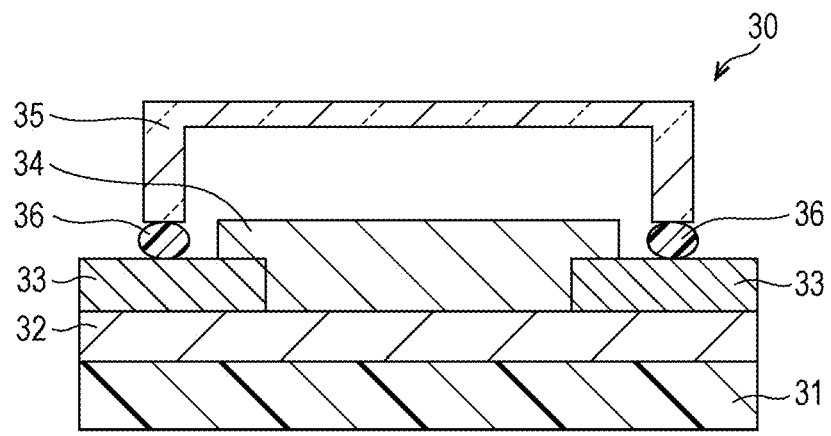
FIG. 3 is a cross-sectional view of a sample for a calcium corrosion test.

A water vapor transmission rate is known as an index for quantitatively evaluating the gas barrier property against water vapor. The water vapor transmission rate is measured by a calcium corrosion test. FIG. 3 is a cross-sectional view of a sample 30 for a calcium corrosion test. A gas barrier film 32 as an object to be measured for the water vapor transmission rate is formed on a film substrate 31. The film substrate 31 has a water vapor transmission rate higher than that of the gas barrier film 32, by an order of magnitude. Therefore, the water vapor transmission rate of the gas barrier film 32 is mainly reflected to the measured results of the water vapor transmission rate. An electrode 33 and calcium 34 are deposited on the gas barrier film 32 by vacuum vapor deposition. A glass cap 35 is attached onto the gas barrier film 32 with a sealing adhesive 36 in a nitrogen atmosphere to seal the calcium 34 by the gas barrier film 32 and the glass cap 35. In this embodiment, the film substrate 31 is made of a polyimide resin, the electrode 33 is made of silver, and the sealing adhesive 36 is made of a photocurable epoxy resin.

The calcium 34 is changed into calcium hydroxide by a chemical reaction (Expression (1)) with water passed through the film substrate 31 and the gas barrier film 32:

$$Ca+2H_2O \rightarrow Ca(OH)_2+H_2 \qquad (1).$$

Figure 4:
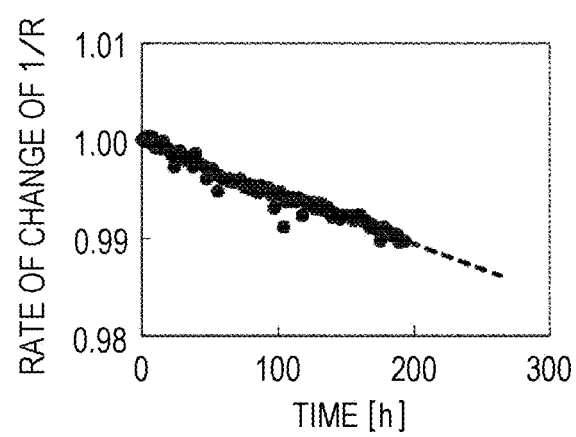
FIG. 4 is a graph showing an example of a change with time in the reciprocal of the resistance value of calcium.

FIG. 4 is a graph showing an example of a change with time in the reciprocal of the electrical resistance value of calcium. Since calcium hydroxide has electric insulation, an increase in the electrical resistance value (a decrease in the reciprocal of the electrical resistance value) is observed with progress of the chemical reaction between calcium and water. The decrease in amount of calcium is estimated and the water vapor transmission rate (Expression (2)) can be calculated from the rate of change in the electrical resistance value (slope of the graph).

Water vapor transmission rate $(g/m^2/day) = -2 \times$ (molar mass of $H_2O$/molar mass of Ca)$\times$Ca density$\times$ electrical resistance of Ca$\times$rate of change in reciprocal of resistance value (2).

In order to shorten the measuring time, the following measurement of water vapor transmission rates of samples is performed in an acceleration environment of 60° C./90% (temperature/humidity). A reference film having a known water vapor transmission rate is prepared in advance and is subjected to a calcium corrosion test in a standard environment of 25° C./50% and in an acceleration environment of 60° C./90%. From the results, the conversion factor for determining the water vapor transmission rate in a standard environment of 25° C./50% from the water vapor transmission rate in an acceleration environment of 60° C./90% is determined. All of the water vapor transmission rates shown below are those in a standard environment of 25° C./50% converted using this conversion factor.

Experiment 1

Gas barrier film samples having different structures formed under different conditions were prepared. The water vapor transmission rates of the individual samples were compared. The structures and film-forming conditions of the samples were as follows.

Sample 1

Figure 5:
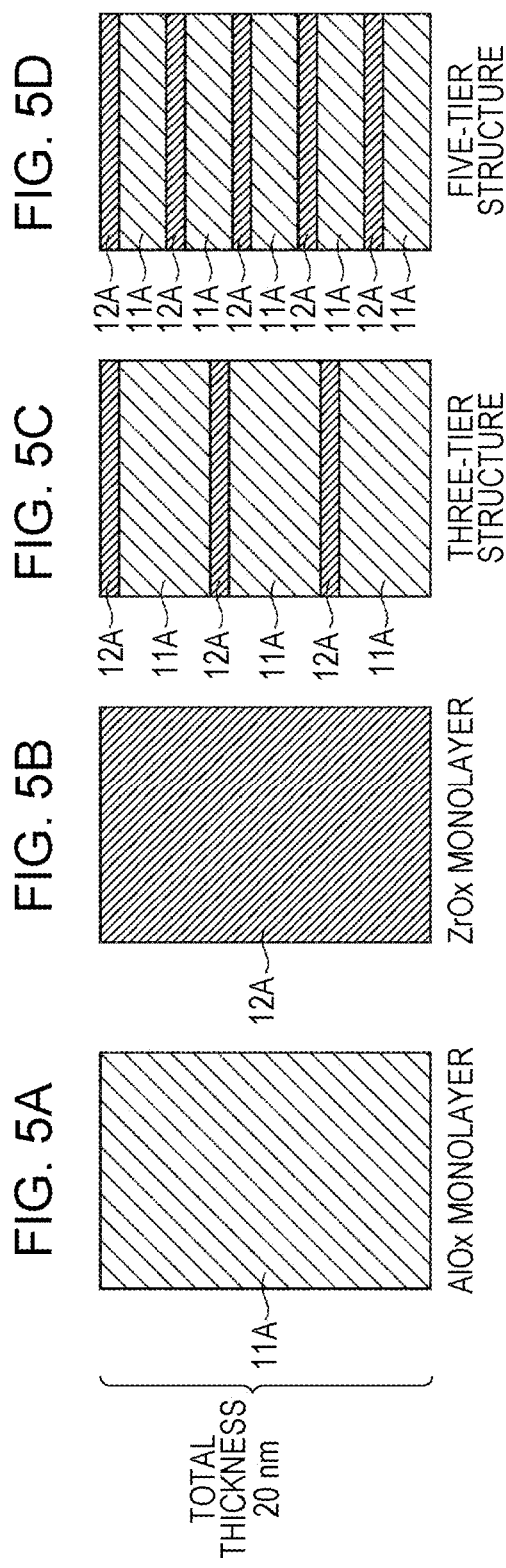
FIGS. 5A to 5D are schematic cross-sectional views of the gas barrier film samples in Experiment 1.

FIG. 5A is a schematic cross-sectional view of the gas barrier film sample 1

An aluminum oxide film 11A was formed on a polyimide film having a thickness of 38 μm by plasma ALD using trimethyl aluminum (TMA: $Al(CH_3)_3$) as a source gas, Ar as a purge gas, and $O_2$ as a reactant gas. A gas barrier film having a thickness of 20 nm was formed through 200 cycles of atomic film formation at a TMA supply time of 0.06 sec, an $O_2$ supply time of 20 sec, a plasma exposure time of 17 sec, a TMA discharge time of 5 sec, and an $O_2$ discharge time of 5 sec. The time for one cycle was about 30 sec, and the total time for the 200 cycles was about 100 min.

Sample 2

FIG. 5B is a schematic cross-sectional view of the gas barrier film sample 2.

A zirconium oxide film 12A was formed on a polyimide film having a thickness of 38 μm by plasma ALD using tetrakis(ethylmethylamino)zirconium (TEMAZ: $(Zr[N(CH_3)(C_2H_5)]_4)$ as a source gas, Ar as a purge gas, and $O_2$ as a reactant gas. A gas barrier film having a thickness of 20 nm was formed through 200 cycles of atomic film formation at a TEMAZ supply time of 0.25 sec, an $O_2$ supply time of 20 sec, a plasma exposure time of 17 sec, a TEMAZ discharge time of 5 sec, and an $O_2$ discharge time of 5 sec. The time for one cycle was about 30 sec, and the total time for the 200 cycles was about 100 min.

Samples described below were all formed on polyimide film substrates having a thickness of 38 μm. The aluminum oxide films 11A of the following samples were all formed by plasma ALD using TMA as the source gas, Ar as the purge gas, and $O_2$ as the reactant gas at a TMA supply time of 0.06 sec, an $O_2$ supply time of 20 sec, a plasma exposure time of 17 sec, a TMA discharge time of 5 sec, and an $O_2$ discharge time of 5 sec where the time for one cycle of atomic film formation was about 30 sec. Zirconium oxide films 12A of the following samples were all formed using TEMAZ as the source gas, Ar as the purge gas, and $O_2$ as the reactant gas at a TEMAZ supply time of 0.25 sec, an $O_2$ supply time of 20 sec, a plasma exposure time of 17 sec, a TEMAZ discharge time of 5 sec, and an $O_2$ discharge time of 5 sec where the time for one cycle of atomic film formation was about 30 sec.

Sample 3

FIG. 5C is a schematic cross-sectional view of the gas barrier film sample 3.

The gas barrier film sample 3 had a three-tier structure composed of a lamination of three units each consisting of an aluminum oxide film 11A and a zirconium oxide film 12A disposed on the aluminum oxide film 11A (hereinafter, referred to as "AlO/ZrO lamination unit"). Each aluminum oxide film 11A had a thickness of 5.7 nm; each zirconium oxide film 12A had a thickness of 1 nm; and the gas barrier film had a thickness of about 20 nm (20.1 nm).

Sample 4

FIG. 5D is a schematic cross-sectional view of the gas barrier film sample 4.

The gas barrier film sample 4 had a five-tier structure composed of a lamination of five AlO/ZrO lamination units. Each aluminum oxide film 11A had a thickness of 3 nm; each zirconium oxide film 12A had a thickness of 1 nm; and the gas barrier film had a thickness of 20 nm.

Figure 6:
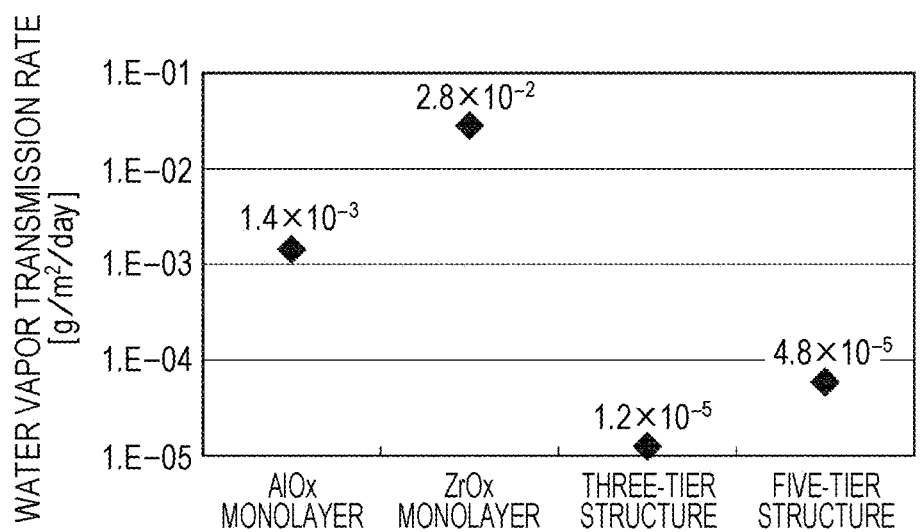
FIG. 6 is a graph showing the measured water vapor transmission rates of samples in Experiment 1.

FIG. 6 shows the water vapor transmission rates of samples in Experiment 1. The results of samples 1 and 2 demonstrate that an aluminum oxide film having the same thickness and structure as those of a zirconium oxide film has a lower water vapor transmission rate than that of the zirconium oxide film. That is, the results suggest that the water vapor barrier property of a gas barrier film mainly depends on the aluminum oxide films.

The samples 1 and 2 having a monolayer structure each had a water vapor transmission rate in an order of $10^{-2}$ to $10^{-3}$ (g/m²/day), whereas the sample 3 having a three-tier structure and the sample 4 having a five-tier structure each had a water vapor transmission rate of $1.0 \times 10^{-4}$ (g/m²/day) or less. Thus, although the samples 1 and 2 and the samples 3 and 4 had the same thicknesses (20 nm), the water vapor transmission rates thereof were different. The reasons of this can be presumed as follows.

Figure 7A:
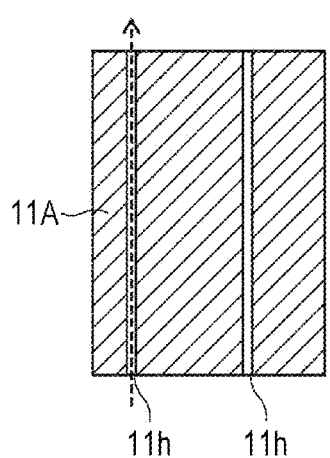
FIGS. 7A and 7B are diagrams for explaining a principle of causing a difference in the measured water vapor transmission rates in Experiment 1.

FIG. 7A is a schematic cross-sectional view of the gas barrier film sample 1. In formation of an aluminum oxide film 11A by ALD, atomic layers are sequentially deposited. The first atomic layer has a risk of having a defect caused by the conditions of the base. The defect of the first atomic layer influences the atomic layer formed thereon to cause a defect at the corresponding position. The defect extends in the laminating direction at the corresponding position with sequential deposition of atomic layers to cause occurrence of a pinhole 11h. This pinhole 11h can be a path for penetration of water and oxygen.

Figure 7B:
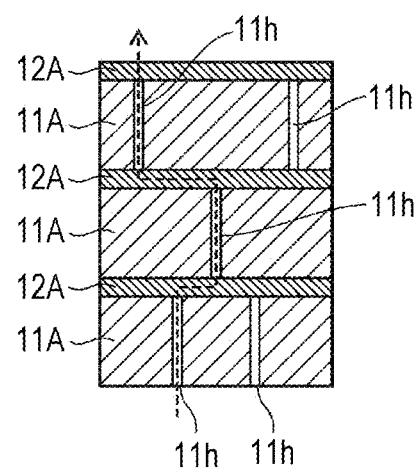
Figure 8C:
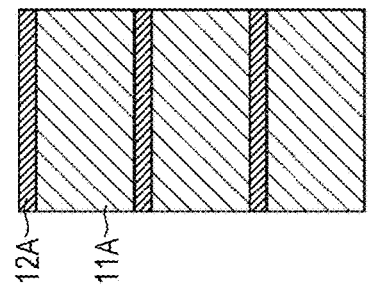
FIGS. 8A to 8F are schematic cross-sectional views of samples in Experiment 2.
Figure 8F:
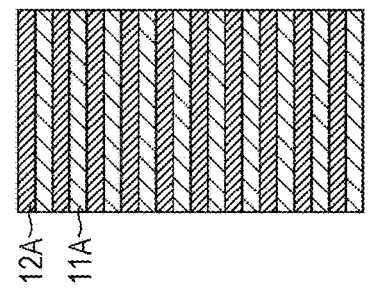
Figure 8B:
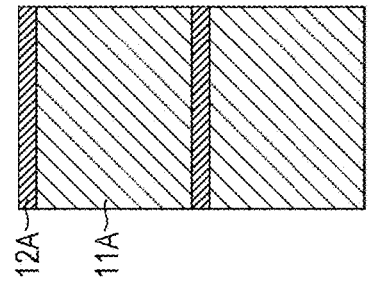
Figure 8E:
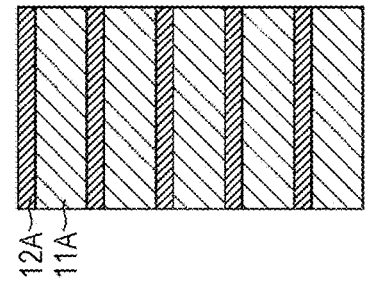
Figure 8A:
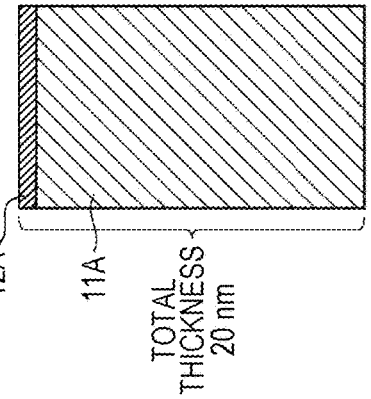
Figure 8D:
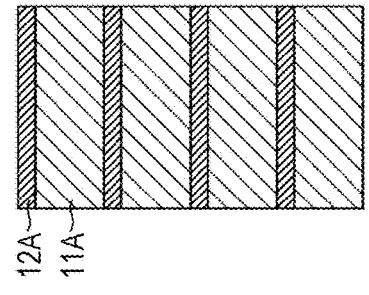

FIG. 7B is a schematic cross-sectional view of the gas barrier film sample 3. This case also has a risk of causing a pinhole 11h in the aluminum oxide film 11A according to the same principle as described above. In the sample 3, however, a zirconium oxide film 12A is disposed between the first aluminum oxide film 11A and the second aluminum oxide film 11A. The zirconium oxide film 12A functions as the base for the second aluminum oxide film 11A. Therefore, although the first atomic layer of the second aluminum oxide film 11A has a risk of having a defect caused by the conditions of the base, i.e., the zirconium oxide film 12A, the position of the defect occurring in the first atomic layer of the second aluminum oxide film 11A tends to have no relation with the position of the defect in the first aluminum oxide film 11A. As a result, as shown in FIG. 7B, the positions of pinholes 11h in the first, second, and third aluminum oxide films 11A are different from one another. This elongates the path for penetration of water and oxygen. The gas barrier property of the gas barrier film is presumed to be thus increased.

Experiment 2

As shown in FIGS. 8A to 8F, gas barrier film samples each having a thickness of 20 nm and one, two, three, four, five, or ten AlO/ZrO lamination units were prepared. In the one-tier structure, the aluminum oxide film had a thickness of 19 nm, and the zirconium oxide film had a thickness of 1 nm. In the two-tier structure, each aluminum oxide film had a thickness of 9 nm, and each zirconium oxide film had a thickness of 1 nm. In the three-tier structure, each aluminum oxide film had a thickness of 5.7 nm, and each zirconium oxide film had a thickness of 1 nm. In four-tier structure, each aluminum oxide film had a thickness of 4 nm, and each zirconium oxide film had a thickness of 1 nm. In five-tier structure, each aluminum oxide film had a thickness of 3 nm, and each zirconium oxide film had a thickness of 1 nm. In ten-tier structure, each aluminum oxide film had a thickness of 1 nm, and each zirconium oxide film had a thickness of 1 nm. Table 1 shows the structures of the samples in Experiment 2.

TABLE 1

| Number of tier | Thickness of AlO film (per one layer) | Thickness of ZrO film (per one layer) | Thickness of gas barrier film |
|---|---|---|---|
| One | 19 nm | 1 nm | 20 nm |
| Two | 9 nm | 1 nm | 20 nm |
| Three | 5.7 nm | 1 nm | 20 nm |
| Four | 4 nm | 1 nm | 20 nm |
| Five | 3 nm | 1 nm | 20 nm |
| Ten | 1 nm | 1 nm | 20 nm |

Figure 9:
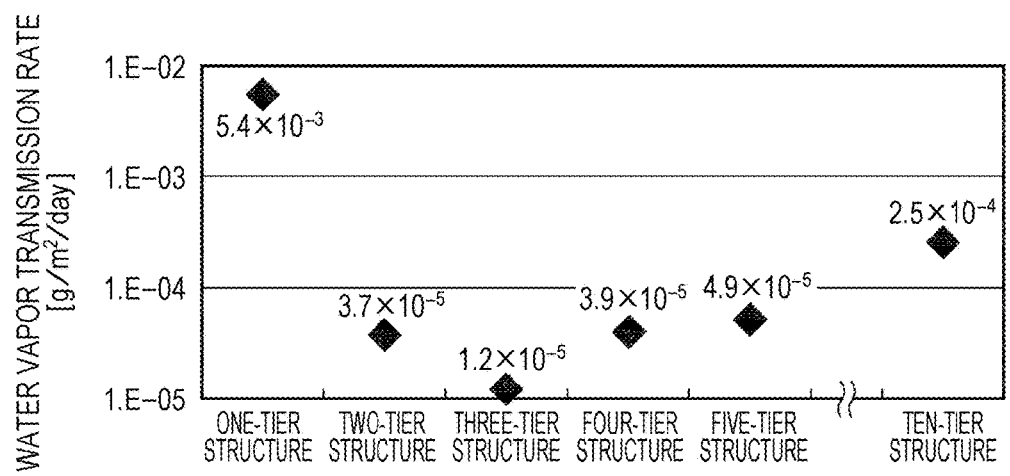
FIG. 9 is a graph showing the measured water vapor transmission rates of samples in Experiment 2.

FIG. 9 shows water vapor transmission rates of samples in Experiment 2. The gas barrier film sample having a two-tier structure had a water vapor transmission rate of $1.0 \times 10^{-4}$ (g/m$^2$/day) or less, whereas the sample having a one-tier structure had a water vapor transmission rate in an order of $10^{-3}$ (g/m$^2$/day). The gas barrier film samples from the two-tier to five-tier structures maintained the water vapor transmission rates in an order of $10^{-5}$ (g/m$^2$/day). Thus, there is a critical point between the one-tier structure and the two-tier structure at which the water vapor transmission rate significantly changes. This result shows that the total thickness of aluminum oxide film necessary for achieving a high gas barrier property in a gas barrier film having a two-tier structure can be smaller than that in a gas barrier film having a one-tier structure. Thus, the time for forming the gas barrier film having the two-tier structure can be reduced than that for forming the gas barrier film having the one-tier structure and having the same gas barrier property as the gas barrier film having the two-tier structure. In the ten-tier structure, the water vapor transmission rate increased to an order of $10^{-4}$ (g/m$^2$/day). In this Experiment, the number of tiers of the gas barrier film was increased, with the total thickness of the gas barrier film being maintained constant. The thickness of one aluminum oxide film, therefore, decreased with an increase in the number of the tiers. In the ten-tier structure, consequently, the water vapor transmission rate increased because of its large number of tiers. This suggests that the aluminum oxide film has a minimum thickness necessary for expressing a high gas barrier property.

Experiment 3

In order to determine the minimum thickness of an aluminum oxide film necessary for achieving a high gas barrier property, as shown in FIGS. 10A to 10E, gas barrier film samples each having two AlO/ZrO lamination units, in which the aluminum oxide film had a thickness of 1 nm, 3 nm, 5 nm, 6 nm, or 7 nm and the zirconium oxide film had a thickness of 1 nm, were prepared. Table 2 shows the structures of the samples in Experiment 3.

TABLE 2

| Number of tier | Thickness of AlO film (per one layer) | Thickness of ZrO film (per one layer) | Thickness of gas barrier film |
|---|---|---|---|
| Two | 1 nm | 1 nm | 4 nm |
| Two | 3 nm | 1 nm | 8 nm |
| Two | 5 nm | 1 nm | 12 nm |
| Two | 6 nm | 1 nm | 14 nm |
| Two | 7 nm | 1 nm | 16 nm |

FIG. 11 shows the water vapor transmission rates of samples in Experiment 3. The gas barrier film sample including aluminum oxide films each having a thickness of 3 nm had a water vapor transmission rate of $1.0 \times 10^{-4}$ (g/m$^2$/day), whereas the sample including aluminum oxide films each having a thickness of 1 nm had a water vapor transmission rate in an order of $10^{-2}$ (g/m$^2$/day). In the gas barrier film samples including aluminum oxide films having a thickness of 3 to 7 nm, the water vapor transmission rates were maintained to be $1.0 \times 10^{-4}$ (g/m$^2$/day) or less. Thus, there is a critical point between the thickness of 1 nm and the thickness of 3 nm at which the water vapor transmission rate significantly changes. The present inventors have further found a tendency that the water vapor transmission rate decreases with an increase in the thickness of the aluminum oxide film and is saturated when the thickness of the aluminum oxide film reaches 6 nm. This result suggests that the thickness of each aluminum oxide film is 3 nm or more for achieving a water vapor transmission rate of $1.0 \times 10^{-4}$ (g/m$^2$/day) or less. This result also suggests that the thickness of each aluminum oxide film may be 6 nm or more for achieving a sufficiently higher gas barrier property.

Figure 12:
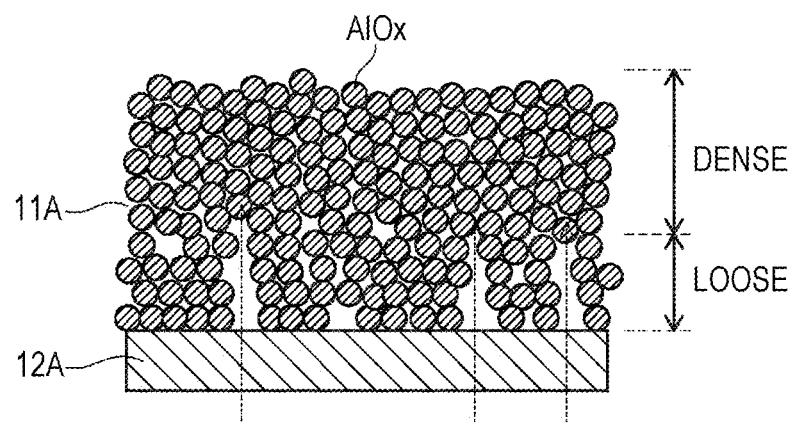
FIG. 12 is a diagram schematically illustrating the appearance near the interface between an aluminum oxide film and its base.

The water vapor transmission rates of aluminum oxide films having thicknesses of 1 nm and 3 nm are highly different from each other. The reasons are probably as follows. In formation of an aluminum oxide film by ALD, atomic layers are deposited one by one. One atomic layer has a thickness of approximately 0.1 nm. The atomic layers near the base are affected by, for example, the crystalline structure and the lattice constant of the base, and the atoms are not necessarily arranged so as to be suitable for forming an aluminum oxide film. As shown in FIG. 12, the density of the aluminum oxide atoms near the interface between the aluminum oxide film and the base tends to be low. In an aluminum oxide film having a certain thickness formed by sequential deposition of atomic layers, the influence by the base weakens, and the density of the aluminum oxide atoms tends to be high. The certain thickness seems to be in a range of 1 to 3 nm.

Experiment 4

Figure 13:
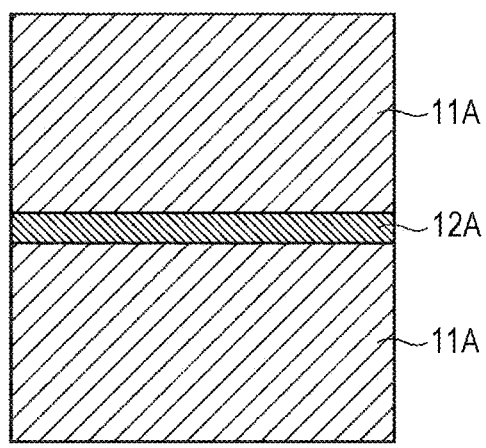
FIG. 13 is a schematic cross-sectional view of a sample in Experiment 4.

As shown in FIG. 13, a sample composed of an aluminum oxide film having a thickness of 9.5 nm, a zirconium oxide film having a thickness of 1 nm, and an aluminum oxide film having a thickness of 9.5 nm deposited in this order was prepared. This sample did not have the uppermost zirconium oxide film and was different from the sample having a two-tier structure shown in FIG. 8B in this point. This sample, however, had a water vapor transmission rate of $2.3 \times 10^{-5}$ (g/m$^2$/day), which was similar to that of the sample having a two-tier structure. These results demonstrate that the uppermost zirconium oxide film hardly participates in the gas barrier property. That is, it is suggested that a minimum structural requirement for achieving a water vapor transmission rate of $1.0 \times 10^{-4}$ (g/m$^2$/day) or less is two aluminum oxide films and a zirconium oxide film disposed between the aluminum oxide films, although the results of Experiment 2 demonstrated that two or more tiers are necessary for achieving such a water vapor transmission rate.

Experiment 5

Figure 14A:
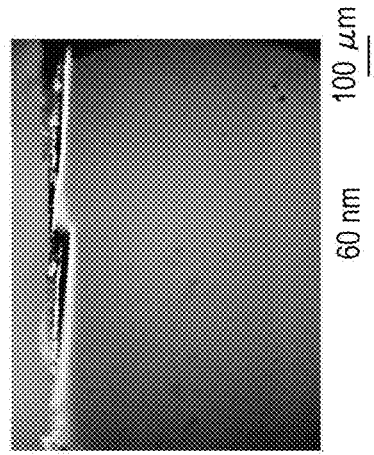
FIGS. 14A to 14C are microscopic photographs of samples after a bending resistance test.
Figure 14B:
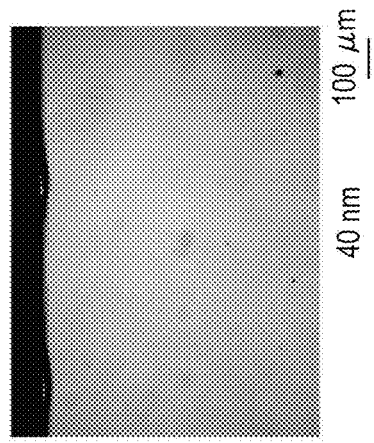
Figure 14C:
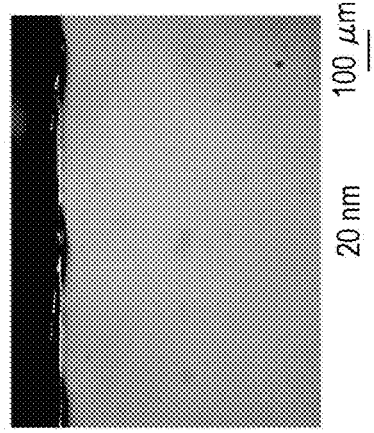
Figure 14D:
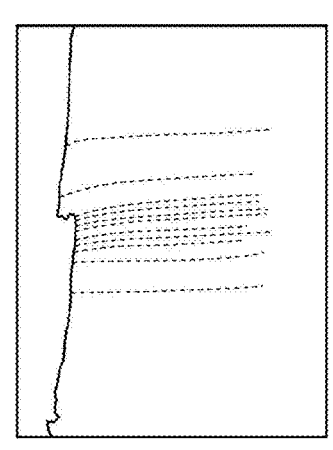
FIGS. 14D to 14F are traced drawings of samples after the bending resistance test.
Figure 14E:
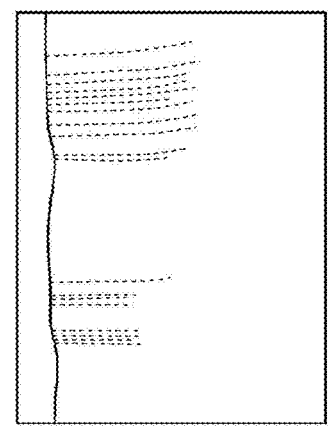
Figure 14F:
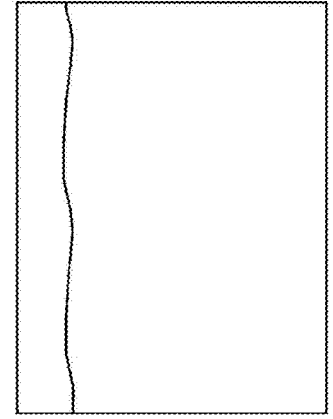

The test of the bending resistance of gas barrier films and its results will be described. Samples each composed of a polyimide film having a thickness of 38 μm and an aluminum oxide film having a thickness of 20 nm, 40 nm, or 60 nm formed on the polyimide film were prepared. Each sample was bent toward the polyimide film side with a radius of curvature of 5 mm and was then flattened. This process was repeated ten times, and each sample was investigated for occurrence of defects such as cracking with an optical microscope. FIGS. 14A to 14C are microscopic photographs of the top views of aluminum oxide films after the bending resistance test. FIGS. 14D to 14F are traced drawings of samples after the bending resistance test. Although no cracking was caused by bending of the sample having the aluminum oxide film of 20 nm, slight cracking (shown by broken lines in the traced drawings) occurred in the samples having the aluminum oxide films of 40 nm or 60 nm. Table 3 shows the results of the bending resistance test.

TABLE 3

| Thickness of AlO film | Bending resistance |
|---|---|
| 20 nm | Good |
| 40 nm | Poor |
| 60 nm | Poor |

The results demonstrate that high bending resistance can be secured by controlling the thickness of the aluminum oxide film to 20 nm or less. The sample in this experiment was a monolayer of aluminum oxide film. A sample having a multilayer structure composed of an aluminum oxide film having a thickness of 20 nm, a zirconium oxide film having a thickness of 1 nm, and an aluminum oxide film having a thickness of 20 nm deposited in this order on a polyimide film having a thickness of 38 μm was prepared and was subjected to the same bending resistance test as in above. Cracking, however, occurred in this sample. This result demonstrates that sufficient resistance against bending cannot be secured only by controlling the thickness of each aluminum oxide film to 20 nm or less. The zirconium oxide film disposed between two aluminum oxide films had a small thickness, 1 nm, and the ability as a stress relaxation layer was therefore low. The bending resistance of the sample having such a multilayer structure, therefore, seems to be almost the same as that of a monolayer of aluminum oxide film having a thickness of 40 nm. In contrast, in a sample having a multilayer structure composed of an aluminum oxide film having a thickness of 10 nm, a zirconium oxide film having a thickness of 1 nm, and an aluminum oxide film having a thickness of 10 nm deposited in this order on a polyimide film having a thickness of 38 μm, no cracking occurred in the bending resistance test. This result suggests that a multilayer structure having a total thickness of the aluminum oxide films of 20 nm or less can secure high bending resistance.

Modification Example of Gas Barrier Film

Embodiments of the gas barrier film have been described above, but the present disclosure is not limited to these embodiments. For example, the following modification examples can be exemplified.

(1) The gas barrier film may further have a upper layer and/or a lower layer of another gas barrier film or an adhesion layer that is a monolayer structure of an inorganic layer, a monolayer structure of a resin layer, or a layered structure composed of an inorganic layer and a resin layer. The inorganic layer can be, for example, silicon nitride, silicon oxide, or silicon oxynitride film formed by PVD or CVD. The resin can be, for example, an acrylic resin, polyimide resin, siloxane resin, phenolic resin, styrene resin, polycarbonate resin, epoxy resin, polyethylene resin, polyester resin, or silicone resin.

(2) In the embodiments, two materials, aluminum oxide and zirconium oxide, were used. The materials are not limited to two types, and a combination of three or more materials may be used. Examples of the material include oxides, nitrides, and oxynitrides of at least one or more metals selected from the group consisting of zirconium (Zr), zinc (Zn), silicon (Si), aluminum (Al), titanium (Ti), hafnium (Hf), tantalum (Ta), and lanthanum (La).

(3) In the embodiments, although the aluminum oxide layers in a gas barrier film had the same thicknesses, the thicknesses may be different. Similarly, although the zirconium oxide layers in a gas barrier film had the same thicknesses, the thicknesses may be different. For example, the thicknesses of the first, second, and third layers may be different from one another. Alternatively, some of the layers have the same thicknesses.

Structure of Film Substrate Provided with a Gas Barrier Film

FIG. 15 is a cross-sectional view schematically illustrating a film substrate provided with a gas barrier film according to an embodiment of the present disclosure. The film substrate 50 provided with a gas barrier film is composed of a film substrate 51 and a gas barrier film 52 disposed on the film substrate 51. The material of the film substrate 51 may be, for example, an acrylic resin, polyimide resin, siloxane resin, phenolic resin, styrene resin, polycarbonate resin, epoxy resin, polyethylene resin, polyester resin, or silicone resin. For example, a gas barrier film including the structure of the gas barrier film according to any one of the embodiments described above can be used as the gas barrier film 52. As described above, the gas barrier films according to the embodiments have high gas barrier properties and high bending resistance. Accordingly, the film substrate 50 provided with the gas barrier film can be suitably used as a substrate of a flexible electronic device. The film substrate 50 provided with the gas barrier film can also be used, for example, as wrapping for food or medicine.

Structure of Electronic Device

FIG. 16 is a cross-sectional view schematically illustrating an electronic device according to an embodiment of the present disclosure. Herein, an organic EL device will be described as an example of the electronic device. The organic EL device 100 includes a first flexible substrate 110, an organic EL element 120, a second flexible substrate 130, and a sealing layer 140.

The first flexible substrate 110 includes a film substrate 111 and a gas barrier film 112.

The organic EL element 120 is an example of the electronic element and includes a first electrode 121, an organic light-emitting layer 122, and a second electrode 123. The first electrode 121 is made of, for example, a light-reflecting conductive material, such as, aluminum, silver, an aluminum alloy, or a silver alloy. The organic light-emitting layer 122 includes a light-emitting layer made of an organic material and optionally includes a hole-injecting layer, a hole-transporting layer, an electron-injecting layer, and an electron-transporting layer. The second electrode 123 is made of, for example, a light-transmitting conductive material, such as, indium tin oxide (ITO), indium zinc oxide (IZO) or a metal thin film.

The second flexible substrate 130 includes a film substrate 131 and a gas barrier film 132.

The sealing layer 140 is made of, for example, a light-transmitting resin material, such as, an acrylic resin or an epoxy resin.

At least one of the gas barrier films 112 and 132 may be a gas barrier film including the structure of the gas barrier film according to any one of the embodiments. The gas barrier films 112 and 132 are both disposed on or above the organic EL element 120, which is an example of the electronic element. The term "on or above" includes not only a case of being in direct contact with the electronic element but also a case of having any layer therebetween.

As in the organic EL device 200 shown in FIG. 17, the second flexible substrate 230 may have a monolayer structure of a resin layer and the sealing layer 240 may include a gas barrier film 241 and a resin layer 242. At least one of the gas barrier films 112 and 241 may be a gas barrier film including the structure of the gas barrier film according to any one of the embodiments.

Figure 18:
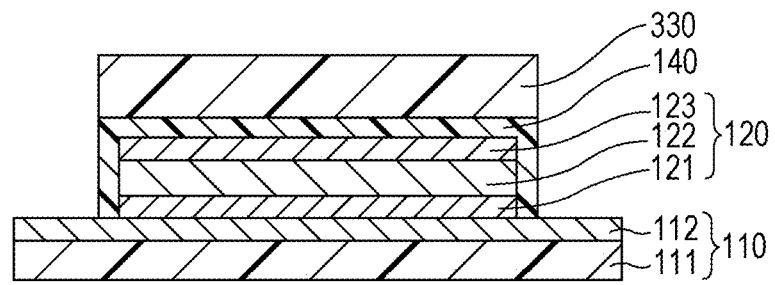
FIG. 18 is a cross-sectional view schematically illustrating a modification example of an electronic device according to an embodiment of the present disclosure.

As in the organic EL device 300 shown in FIG. 18, the second flexible substrate 330 may be a monolayer structure of a resin layer; and the gas barrier film 112 may be a gas barrier film including the structure of the gas barrier film according to any one of the embodiments.

Figure 19:
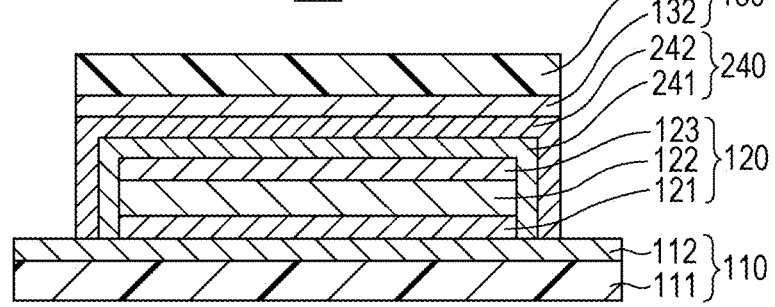
FIG. 19 is a cross-sectional view schematically illustrating a modification example of an electronic device according to an embodiment of the present disclosure.

As in the organic EL device 400 shown in FIG. 19, the first flexible substrate 110, the second flexible substrate 130, and the sealing layer 240 may include gas barrier films 112, 132, and 241, respectively; and at least one of the gas barrier films 112, 132, and 241 may be a gas barrier film including the structure of the gas barrier film according to any one of the embodiments.

Figure 20:
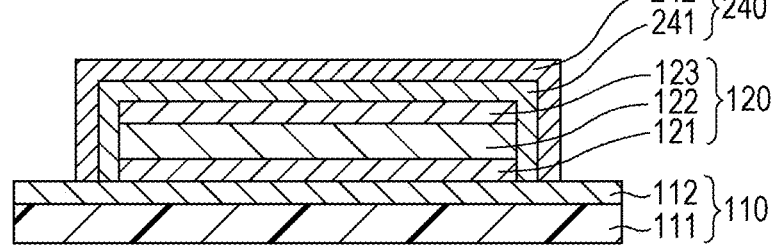
FIG. 20 is a cross-sectional view schematically illustrating a modification example of an electronic device according to an embodiment of the present disclosure.

As in the organic EL device 500 shown in FIG. 20, the sealing layer 240 may seal the upper surface of the organic EL element 120 without disposing any second flexible substrate; and at least one of the gas barrier films 112 and 241 may be a gas barrier film including the structure of the gas barrier film according to any one of the embodiments.

Figure 21:
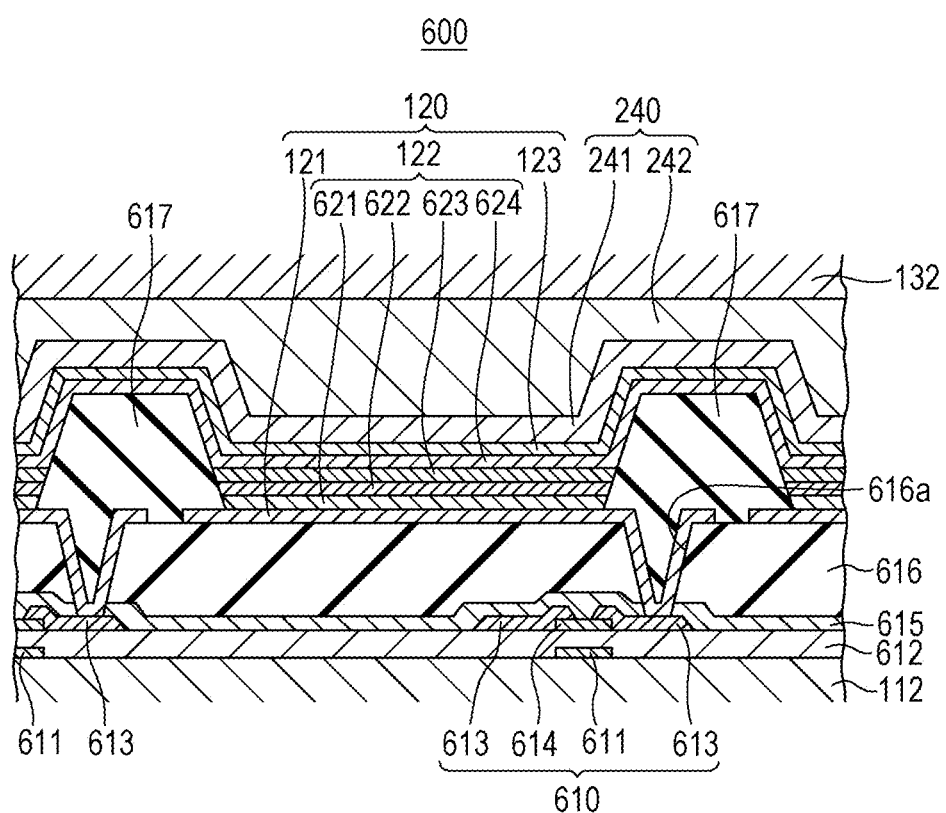
FIG. 21 is a cross-sectional view schematically illustrating a modification example of an electronic device according to an embodiment of the present disclosure.

The organic EL device may include a plurality of organic EL elements. An organic EL device for a display includes a plurality of organic EL elements each corresponding to one subpixel. FIG. 21 shows an example of the structure of an organic EL device for a display. This drawing shows one subpixel. The organic EL device 600 includes a thin-film transistor 610, as an example of the electronic element, on a gas barrier film 112. The thin-film transistor 610 includes a gate electrode 611, a gate insulating film 612, a source and drain electrode 613, and a semiconductor film 614. The semiconductor film 614 is made of, for example, amorphous silicon, indium gallium zinc oxide (IGZO), or an organic semiconductor material. The organic EL device 600 further includes a gas barrier film 615 covering the thin-film transistor 610 and an interlayer insulating film 616 disposed on the gas barrier film 615. The gas barrier film 615 and the interlayer insulating film 616 have a contact hole 616a. The organic EL device 600 further includes an organic EL element 120, as an example of the electronic element, in a region defined by a partition wall 617 on the interlayer insulating film 616. The organic EL element 120 includes a first electrode 121, an organic light-emitting layer 122, and a second electrode 123. The first electrode 121 partially extends into the contact hole 616a and is connected to the source and drain electrode 613 of the thin-film transistor 610. The organic light-emitting layer 122 includes a hole-injecting layer 621, a hole-transporting layer 622, an organic light-emitting layer 623, and an electron-transporting layer 624. The organic EL device 600 further includes a sealing layer 240 on the organic EL element 120 and includes a gas barrier film 132 on the sealing layer 240. The sealing layer 240 includes a gas barrier film 241 and a resin layer 242.

As described above, the organic EL device 600 includes the gas barrier films 112, 615, 241, and 132. At least one of these gas barrier films may be a gas barrier film including the structure of the gas barrier film according to any one of the embodiments.

The gas barrier film of the present disclosure can be applied to every product that needs a gas barrier property, such as display devices, light emitting devices, portable electronic devices, semiconductor devices, and batteries. The gas barrier film of the present disclosure can also be applied to packing members that need gas barrier properties for wrapping food, medicine, precision instruments, cards, works of art, etc.

What is claimed is:

1. A gas barrier film comprising:
two or more first barrier layers each consisting of a first inorganic material; the two or more first barrier layers including
an uppermost first barrier layer provided on an upper end of the two or more first barrier layers and
a lowermost first barrier layer provided on a lower end of the two or more first barrier layers; and
one or more second barrier layers each consisting of a second inorganic material different from the first inorganic material, the second inorganic material not being silicon oxide, wherein:
each of the two or more first barrier layers and each of the one or more second barrier layers are alternately stacked;
the first inorganic material comprises aluminum oxide;
each of the two or more first barrier layers has a thickness of 3 nm or more;
the total thickness of
the two or more first barrier layers of the first inorganic material between the uppermost first barrier layer and the lowermost first barrier layer inclusive of the uppermost first barrier layer and the lowermost first barrier layer and
the one or more second barrier layers is 20 nm or less;
the two or more first barrier layers and the one or more second barrier layers are formed by atomic layer deposition; and
the gas barrier film includes no aluminum oxide layer other than the two or more first barrier layers.

2. The gas barrier film according to claim 1, wherein a water vapor transmission rate of the gas barrier film is $1.0 \times 10^{-4}$ g/m$^2$/day or less.

3. The gas barrier film according to claim 1, wherein
the second inorganic material is an oxide of at least one metal selected from the group consisting of zirconium, zinc, titanium, hafnium, tantalum, and lanthanum.

4. The gas barrier film according to claim 1, wherein
the second inorganic material is a nitride or an oxynitride of at least one metal selected from the group consisting of zirconium, zinc, silicon, aluminum, titanium, hafnium, tantalum, and lanthanum.

5. The gas barrier film according to claim 1, wherein the gas barrier film has bending resistance such that no cracking is caused when a process is repeated ten times, the process having a step of bending the gas barrier film with a radius of curvature of 5 mm and a step of flattening the gas barrier film after bending.

6. A film substrate provided with a gas barrier film, comprising:
a film substrate; and
a gas barrier film disposed on the film substrate, the gas barrier film comprising:
two or more first barrier layers each consisting of a first inorganic material; the two or more first barrier layers including
an uppermost first barrier layer provided on an upper end of the two or more first barrier layers and
a lowermost first barrier layer provided on a lower end of the two or more first barrier layers; and one or more second barrier layers each consisting of a second inorganic material different from the first inorganic materials, the second inorganic material not being silicon oxide, wherein:
each of the two or more first barrier layers and each of the one or more second barrier layers are alternately stacked;
the first inorganic material comprises aluminum oxide;
each of the two or more first barrier layers has a thickness of 3 nm or more;
the total thickness of
the two or more first barrier layers of the first inorganic material between the uppermost first barrier layer and the lowermost first barrier layer inclusive of the uppermost first barrier layer and the lowermost first barrier layer and
the one or more second barrier layers
is 20 nm or less;
the two or more first barrier layers and the one or more second barrier layer are formed by atomic layer deposition; and
the gas barrier film includes no aluminum oxide layer other than the two or more first barrier layers.

7. An electronic device comprising:
a film substrate;
a gas barrier film disposed on the film substrate; and
an electronic element disposed on the gas barrier film,
wherein:
the gas barrier film comprises:
two or more first barrier layers each consisting of a first inorganic material; the two or more first barrier layers including
an uppermost first barrier layer provided on an upper end of the two or more first barrier layers and
a lowermost first barrier layer provided on a lower end of the two or more first barrier layers; and
one or more second barrier layers each consisting of a second inorganic material different from the first inorganic materials, the second inorganic material not being silicon oxide;
wherein:
each of the two or more first barrier layers and each of the one or more second barrier layers are alternately stacked;
the first inorganic material comprises aluminum oxide;
each of the two or more first barrier layers has a thickness of 3 nm or more;
the total thickness of
the two or more first barrier layers of the first inorganic material between the uppermost first barrier layer and the lowermost first barrier layer inclusive of the uppermost first barrier layer and the lowermost first barrier layer and the one or more second barrier layers
is 20 nm or less;
the two or more first barrier layers and the one or more second barrier layers are formed by atomic layer deposition; and
the gas barrier film includes no aluminum oxide layer other than the two or more first barrier layers.

8. An electronic device comprising:
an electronic element; and
a gas barrier film disposed on or above the electronic element,
wherein:
the gas barrier film comprises
two or more first barrier layers each consisting of a first inorganic material; the two or more first barrier layers including
an uppermost first barrier layer provided on an upper end of the two or more first barrier layers and
a lowermost first barrier layer provided on a lower end of the two or more first barrier layers; and
one or more second barrier layers each consisting of a second inorganic material different from the first inorganic material, the second inorganic material not being silicon oxide;
each of the two or more first barrier layers and each of the one or more second barrier layers are alternately stacked;
the first inorganic material comprises aluminum oxide;
each of the two or more first barrier layers has a thickness of 3 nm or more;
the total thickness of
the two or more first barrier layers of the first inorganic material between the uppermost first barrier layer and the lowermost first barrier layer inclusive of the uppermost first barrier layer and the lowermost first barrier layer and
the one or more second barrier layers
is 20 nm or less;
the two or more first barrier layers and the one or more second barrier layers are formed by atomic layer deposition; and
the gas barrier film includes no aluminum oxide layer other than the two or more first barrier layers.

9. A gas barrier film consisting of:
two or more first barrier layers each consisting of a first inorganic material; the two or more first barrier layers including
an uppermost first barrier layer provided on an upper end of the two or more first barrier layers and
a lowermost first barrier layer provided on a lower end of the two or more first barrier layers; and
one or more second barrier layers each consisting of a second inorganic material different from the first inorganic material, the second inorganic material not being silicon oxide, wherein:
each of the two or more first barrier layers and each of the one or more second barrier layers are alternately stacked;
the first inorganic material comprises aluminum oxide;
each of the two or more first barrier layers has a thickness of 3 nm or more;
the total thickness of the
two or more first barrier layers of the first inorganic material between the uppermost first barrier layer and the lowermost first barrier layer inclusive of the uppermost first barrier layer and the lowermost first barrier layer and
the one or more second barrier layers
is 20 nm or less;
the two or more first barrier layers and the one or more second barrier layers are formed by atomic layer deposition; and
the gas barrier film includes no aluminum oxide layer other than the two or more first barrier layers.

* * * * *